United States Patent
Lopez et al.

(10) Patent No.: US 6,687,102 B2
(45) Date of Patent: Feb. 3, 2004

(54) BATTERY-OPERATED POWER SUPPLY UNIT

(75) Inventors: Daniel Lopez, Villingen-Schwenningen (DE); Jean Paul Louvel, Villingen-Schwenningen (DE)

(73) Assignee: Thomson Licensing S.A., Boulogne (FR)

( * ) Notice: Subject to any disclaimer, the term of this patent is extended or adjusted under 35 U.S.C. 154(b) by 252 days.

(21) Appl. No.: 09/930,056

(22) Filed: Aug. 15, 2001

(65) Prior Publication Data

US 2002/0027756 A1 Mar. 7, 2002

(51) Int. Cl.$^7$ ................................................ H02H 3/18
(52) U.S. Cl. ......................................... 361/84; 307/127
(58) Field of Search ........................... 320/165; 361/84, 361/82; 307/127

(56) References Cited

U.S. PATENT DOCUMENTS

| | | | | |
|---|---|---|---|---|
| 5,012,381 A | * | 4/1991 | Elliott et al. | 361/84 |
| 5,349,489 A | * | 9/1994 | Schelen | 361/77 |
| 5,757,600 A | * | 5/1998 | Kiraly | 361/84 |
| 6,023,418 A | * | 2/2000 | Engira | 363/63 |
| 6,304,422 B1 | * | 10/2001 | Sander et al. | 361/84 |
| 6,519,126 B2 | * | 2/2003 | Tamura | 361/84 |
| 6,577,482 B1 | * | 6/2003 | Eisenhardt et al. | 361/84 |

FOREIGN PATENT DOCUMENTS

| | | |
|---|---|---|
| DE | 3430961 | 2/1986 |
| DE | 3741394 | 6/1989 |
| DE | 4326423 | 2/1995 |

* cited by examiner

Primary Examiner—Adolf D. Berhane
(74) Attorney, Agent, or Firm—Joseph S. Tripoli; Joseph J. Lakis; Sammy S. Henig

(57) ABSTRACT

The battery-operated power supply unit, which comprises a switching transistor whose current terminals are connected in series with a battery, in the current path of the power supply unit, comprises a protective circuit, which is arranged across the current terminals of the switching transistor and evaluates the differential voltage across the switching transistor. The switching transistor is in particular a MOSFET with a parallel-connected internal diode. In the event of too high a differential voltage, the power supply unit or an appliance connected downstream is switched off, so that the switching transistor is not destroyed in the event of a fault. The protective circuit contains, in particular, a threshold circuit with a transistor whose base and emitter are connected across the current terminals of the switching transistor and whose base bias voltage is set via a voltage divider in such a way that, in the event of too high a differential voltage, the transistor switches on and, in this way, triggers a turn-off signal via the collector.

14 Claims, 1 Drawing Sheet

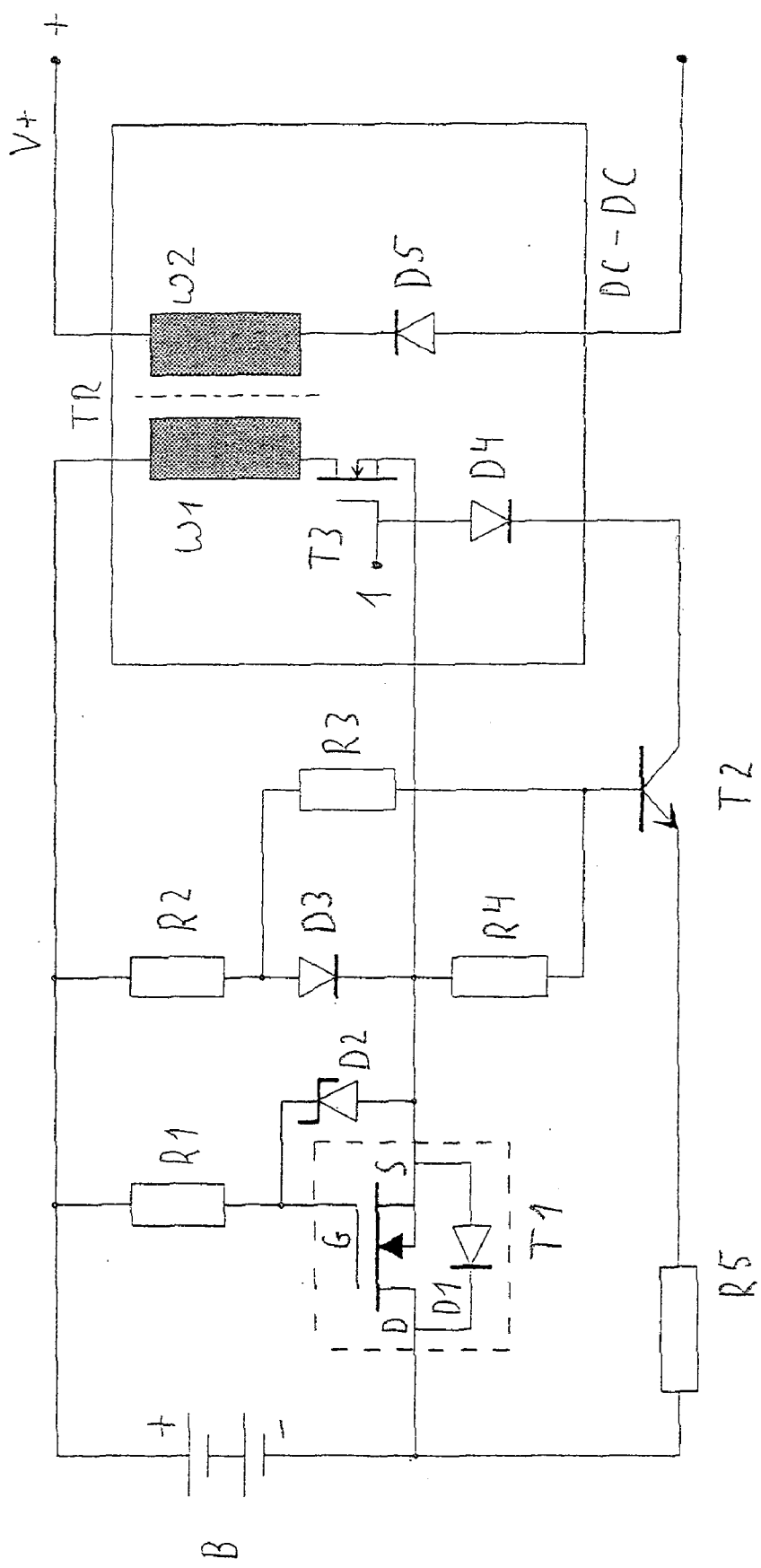
Fig.

BATTERY-OPERATED POWER SUPPLY UNIT

BACKGROUND OF THE INVENTION

The invention is based on a power supply unit operating with a battery, as often used, for example, in portable appliances in consumer electronics. Appliances of this type need protection against polarity reversal of the battery voltage, since, in the case of specific battery types, batteries can be inserted the wrong way round and, as a result of an inverted battery voltage, electrical components belonging to the appliance, in particular electrolytic capacitors, can be destroyed.

To provide protection against polarity reversal of the battery, it is known to arrange a diode or a switching element in series with the battery. However, diodes have the disadvantage that they have a relatively high forward voltage and therefore exhibit not inconsiderable losses, which is undesirable specifically during battery operation. More suitable as a protection against polarity reversal is therefore a switching transistor, in particular a MOSFET, which has a relatively low forward resistance when it is switched on fully. The base of a MOSFET is in this case wired in such a way that the MOSFET is turned on completely with the correct battery polarity and blocks if the battery polarity is wrong. Such protective circuits to counter polarity reversal of the battery are disclosed, for example, by DE-A-196 03 117 and EP-A-0 918 389.

The object of the invention is to specify a power supply unit operating with a battery and comprising a switching transistor which is arranged in the current path of the power supply unit, in which the switching transistor is protected against destruction.

SUMMARY OF THE INVENTION

The power supply unit of the invention, which has a switching transistor whose current terminals are arranged in series with a battery, in the current path of the power supply unit, has a protective circuit which is arranged across the current terminals of the switching transistor and evaluates the differential voltage across the switching transistor. In the event of too high a differential voltage, the power supply unit or the appliance is switched off, so that the switching transistor cannot be destroyed.

In particular if the switching transistor used is a MOSFET, which usually has a parallel-connected internal diode, there is a risk to the latter if it is not turned on at a high current or not turned on correctly. The internal diode of the MOSFET is normally by nature a poor diode with a high forward voltage. In particular in appliances with a high current consumption, this diode would heat up substantially and, in this case, constitute a safety problem. The protective circuit contains in particular a threshold circuit which reacts in the event of too high a differential voltage across the current terminals of the switching transistor, so that there is no risk to the MOSFET.

In the event of too high a differential voltage, the protective circuit can, for example, switch off the appliance per se or significant parts of the appliance, so that the current flow is reduced to a non-hazardous value. If the power supply unit has a DC-DC converter, then the switching transistor of the DC-DC converter can advantageously also be switched off directly. Battery-operated power supply units with a DC-DC converter are needed in particular for portable television sets.

The protective circuit used can in particular be a simple transistor stage with a transistor whose base and emitter are connected across the current terminals of the switching transistor and whose base bias voltage is set via a voltage divider in such a way that, in the event of too high a differential voltage, the transistor switches on and, in this way, triggers a turn-off signal via the collector.

BRIEF DESCRIPTION OF THE DRAWING

The invention will be explained in more detail below by way of example using a schematic circuit diagram, in which:

The FIGURE shows a power supply unit with a battery and a switching transistor connected in series.

DETAILED DESCRIPTION OF PREFERRED EMBODIMENTS

The power supply unit illustrated in the FIGURE operates with a battery B and has a switching transistor T1, a MOSFET in this exemplary embodiment, which is connected with its current terminals in series with the battery B. The MOSFET T1 contains an internal diode D1, which is connected in parallel with the current terminals drain D and source S, in order to prevent the MOSFET T1 being operated in an inverse mode. The gate G of the MOSFET is connected via a resistor R1 to the positive terminal of the battery B, and via a zener diode D to the source terminal of the MOSFET T1. Given the correct polarity of the battery, illustrated in the FIGURE, this results in a positive voltage on the gate G, formed by the voltage divider with the resistor R1 and the diodes D2 and D1, so that the MOSFET T1 conducts. In the event of wrong polarity of the battery B, the gate/source voltage is negative, so that the MOSFET T1 remains off, and likewise the diode D1 blocks.

In the event of a fault, for example if the Schottky diode D is ruptured and produces a short circuit, there is the risk that the MOSFET T1 will not be turned on correctly. In this case, the current would flow through the diode D1, and the latter would heat up substantially, in particular under heavy load, and as a result would constitute a safety problem. A current of 6 A, for example, would produce a voltage drop of one volt across the diode D1, so that a power loss of 6 W would arise in the diode.

In order to protect the switching transistor T1 against overheating, which would constitute a hazard to the appliance, a protective circuit with a transistor T2, diode D3 and resistors R2–R5 is therefore provided, which measures the differential voltage across the current terminals of the switching transistor T1 and, starting at a specific threshold voltage, switches off either the appliance or the power supply unit itself. In this case, the transistor T2 is connected by its base via a resistor R4 to the source terminal S, and by its emitter via a resistor R5 to the drain terminal D of the MOSFET T1, so that in this way a threshold circuit is produced which turns the transistor T2 on in the event of too high a differential voltage.

In this case, the base of the transistor T2 is provided, via the resistor R5 and a voltage divider, with a defined bias voltage, by being connected to the positive terminal of the battery B via two resistors R2 and R3, and by the junction between the two resistors R2 and R3 being clamped, via a diode D3, to the voltage applied to the source terminal S. As a result, the base of the transistor T2 has a bias voltage of about 200 mV. Under normal conditions, when the MOSFET T1 is turned on fully, the forward resistance is about 20 mOhm, so that at a current of 6 A, there is only a voltage of 0.12 V differential voltage across the current terminals D, S of the MOSFET. In this case, the transistor T2 remains blocked. Only when the MOSFET is not turned on or not turned on correctly, so that a higher voltage drop is produced via the diode D1, does the transistor T turn on.

Therefore, in the event of a fault, the collector of the transistor T2 triggers a voltage signal with which, for example, the power supply unit can be switched off via a further switch. If, as in this exemplary embodiment, the power supply unit has a DC-DC converter to generate a higher voltage, the DC-DC converter can be switched off via the collector of the transistor T2 by the base of the switching transistor T3 of the DC-DC converter being connected, via a diode D4, directly to the collector of the transistor T2. If the transistor T2 turns on, then the base of the switching transistor T3 is connected to the negative terminal of the battery, so that the DC-DC converter switches off as a result, and the current flow through the MOSFET T1 is interrupted.

In this exemplary embodiment, the DC-DC converter is a flyback converter with a transformer TR, whose primary winding W1 is in series with its switching transistor T3 and the battery B, and whose secondary winding W2 and a diode D5 provide an output voltage V+. The base 1 of the switching transistor T3 is driven by a driver circuit in a known manner. It is therefore possible, with few components, to specify a reliable protective circuit which, in the event of too high a differential voltage across the current terminals of the switching transistor T1 protects the latter reliably and, in particular in the case of a MOSFET with an internal diode, in the event of a fault prevents excessively high heating of the MOSFET and therefore its destruction.

What is claimed is:

1. Power supply unit operating as a DC-DC converter with a battery, the power supply comprising: a switching transistor arranged with its current terminals in the current path of the battery for providing battery polarity protection, a protective circuit for said switching transistor, said protective circuit being arranged across the current terminals of said first switching transistor and having a threshold circuit for evaluating the differential voltage across said switching transistor and, in the event of too high a differential voltage across the current terminals of said first switching transistor, said protective circuit switches off said DC-DC converter.

2. Power supply unit according to claim 1, wherein said switching transistor has a parallel-connected diode, and in that the threshold voltage of said protective circuit is defined by the forward voltage of said diode.

3. Power supply unit according to claim 1, wherein said protective circuit ahs a transistor whose base-emitter junction is connected across the current terminals of said switching transistor.

4. Power supply unit according to claim 3, wherein the collector of said transistor is coupled via a diode to the base and a switching transistor of said DC-DC converter, and in the event too high a differential voltage switches off said power supply unit via said switching transistor.

5. Power supply unit according to claim 3, wherein between the positive voltage of said battery and the base of the transistor a first resistor is arranged which, with a diode and a second resistor, forms a voltage divider with respect to the negative terminal of said battery.

6. Power supply unit according to claim 1, wherein said switching transistor is a MOSFET with an internal diode.

7. Power supply unit according to claim 6, wherein said MOSFET is a normally-off MOSFET, whose drain is coupled to the negative terminal of said battery, whose source is coupled to the positive terminal of the power supply unit, and whose gate is coupled to the positive terminal of said power supply unit.

8. Power supply unit according to claim 7, wherein said gate is connected via a third resistor to the positive terminal of said power supply unit, and via a diode to the source terminal of said MOSFET.

9. Power supply unit according to claim 6, wherein said MOSFET is a normally-off MOSFET, which is arranged with its current terminals in the return current path of the power supply unit.

10. Power supply unit according to claim 9, wherein the gate of said MOSFET is connected via a third resistor to the positive terminal of said power supply unit, and via a diode to the source terminal of said MOSFET for operating said MOSFET as a battery polarity protecting switching transistor.

11. Power supply unit operating with a battery, and comprising a switching transistor, which is arranged with its current terminals in the current path of the power supply unit, the switching transistor operable for providing battery polarity protection, a protection circuit for said switching transistor, said protection circuit being arranged across the current terminals of said switching transistor, which evaluates the differential voltage across said switching transistor, said protective circuit comprising a threshold circuit which, in the event of too high a differential voltage, switches off the power supply unit or an appliance connected downstream.

12. Power supply unit according to claim 11, wherein the power supply comprises a DC-DC converter, and wherein said protective circuit switches off said DC-DC converter in the event of too high a differential voltage.

13. Power supply unit according to claim 11, wherein said protective circuit has a transistor whose base and emitter terminals are connected across the current terminals of said switching transistor.

14. Power supply unit according to claim 11, wherein said switching transistor is a MOSFET with an internal diode.

* * * * *